(12) United States Patent
Lutz et al.

(10) Patent No.: US 6,816,389 B1
(45) Date of Patent: Nov. 9, 2004

(54) LED MODULE LATCH SYSTEM

(75) Inventors: Robert J. Lutz, Bruce, SD (US); Neil J. Andal, Brookings, SD (US); Nathan L. Nearman, Brookings, SD (US)

(73) Assignee: Daktronics, Inc., Brookings, SD (US)

( * ) Notice: Subject to any disclaimer, the term of this patent is extended or adjusted under 35 U.S.C. 154(b) by 0 days.

(21) Appl. No.: 10/459,952

(22) Filed: Jun. 12, 2003

(51) Int. Cl.[7] .............................. H05K 7/14; H05K 7/18
(52) U.S. Cl. ........................ 361/801; 361/681; 361/825; 361/686; 439/350
(58) Field of Search ................................. 361/801, 825, 361/787, 686, 681, 685; 29/281.4; 411/555; 439/350, 357

(56) References Cited

U.S. PATENT DOCUMENTS

| | | | | |
|---|---|---|---|---|
| 2,580,666 A | * | 1/1952 | Dzus | 411/555 |
| 3,584,350 A | * | 6/1971 | Senhenk | 411/555 |
| 5,004,430 A | * | 4/1991 | DelGuidice et al. | 439/350 |
| 6,347,442 B1 | * | 2/2002 | Hwang | 29/281.4 |

* cited by examiner

*Primary Examiner*—Tulsidas Patel
*Assistant Examiner*—Hung S. Bui
(74) *Attorney, Agent, or Firm*—Hugh D. Jaeger

(57) ABSTRACT

An LED module latch system for quickly and readily attaching or detaching an LED module to an included mounting panel in an informational display. An LED module having one or more positionable helical spring latches adjacent to the geometry of the mounting panel is secured to the mounting panel by engagement of the helical spring latches. Each helical spring latch includes a pivot pin and a helical spring which are rotatingly positioned to cause intimate rotational engagement of the helical springs with the geometry of the mounting panel.

53 Claims, 7 Drawing Sheets

LED MODULE LATCH SYSTEM

CROSS REFERENCES TO RELATED APPLICATIONS

None.

BACKGROUND OF THE INVENTION

1. Field of the Invention

The present invention is for a latching system and, more particularly, is for a latching system for quickly and readily attaching or detaching an LED module to an included mounting panel.

2. Description of the Prior Art

Prior and current art LED display structures include LED modules which require maintenance, such as for replacement of nonfunctioning LED (light emitting diode) pixels, faulty circuitry, installation of updated circuitry, cleaning, and other situations requiring removal or replacement of the LED modules. Often, removal or replacement for whatever reason requires lengthy and arduous manipulation of everyday fasteners known in the art, such as, but not limited to, screws and nut and bolt assemblies, by a variety of hand tools. Some devices could be accessed only from the front side or from the back side, but not from both sides. Also, new installation of an LED display structure including multiple LED modules can be difficult due to size and weight, especially when installed in a hard to access area. Clearly, what is needed and what is provided by the instant invention is a system easily accessed from the front or back for attachment or detachment of an LED module by a simple method and which is quick and efficient and which also can facilitate gravitationally challenged installations by having multiple module components which can be installed one at a time on an individual assembly basis instead of one large heavy assembly structure.

SUMMARY OF THE INVENTION

The general purpose of the present invention is to provide an LED module latch system. The LED module latch system comprises an LED module and a mounting panel. The LED module includes an LED housing, an LED panel, and a louver panel; and the rear side of the LED housing includes angled latch support brackets each having a plurality of helical spring latches which interface between the LED housing and the mounting panel. Mounting fixtures and other features for support of the helical spring latches are located on each latch support bracket to provide for securing of the helical spring latches which include mutually engaging helical springs and pivot pins attached and aligned to each other and to the mounting fixtures. Each helical spring, having a top view profile being that generally of a D-ring, secures around and aside, about and through, a pivot pin. The helical spring is mounted off-center from the pivot pin and is rotated to sweepingly position the D-shaped profile over and about a portion of the mounting panel to provide for intimate frictional engagement thereto. The helical spring is positioned by rotation in an opposite rotational direction to disengage from intimate frictional engagement with the mounting panel.

According to an embodiment of the present invention, there is provided an LED module latch system having an LED module including an LED housing, an LED panel and a louver panel, latch support brackets secured to the rear of the LED housing, mounting fixtures extending rearwardly from the latch support brackets, and helical spring latches, each including a pivot pin and a connected helical spring, secured via the mounting fixtures to the latch support brackets. Also included in the LED module latch system is a mounting panel which includes a cutout and which serves as a mounting base to which the LED module is secured by action of the helical spring latches.

One significant aspect and feature of the present invention is an LED module latch system having components or assemblies which can be easily and readily installed, removed or exchanged.

Another significant aspect and feature of the present invention is an LED module latch system having an LED module which aligns to and which readily engages or disengages a mounting panel.

Still another significant aspect and feature of the present invention is an LED module latch system having an LED module which includes an LED housing, an LED panel, and a louver panel.

Yet another significant aspect and feature of the present invention is a plurality of helical spring latches aligned to and extending rearwardly from latch support brackets on the LED housing of the LED module.

A further significant aspect and feature of the present invention is the use of helical spring latches each including at least a pivot pin and an attached helical spring. Mounting fixtures support the components of the helical spring latches.

Another significant aspect and feature of the present invention is the incorporation of one or more helical latches which are accessible for rotational actuation from the front side or the rear side of the LED module latch system for the purpose of latch engagement or disengagement.

A still further significant aspect and feature of the present invention is structure of the LED module including upper and lower support brackets and helical spring latches which extend therefrom and through a cutout in a mounting panel to enable subsequent rotational positioning of the pivot pins and attached helical springs, i.e., the helical spring latches, to engage the mounting panel for the purpose of secure attachment of the LED module to the mounting panel.

Having thus set forth significant aspects and features of an embodiment of the present invention, it is the principal object of the present invention to provide an LED module latch system.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENT

Figure 1:
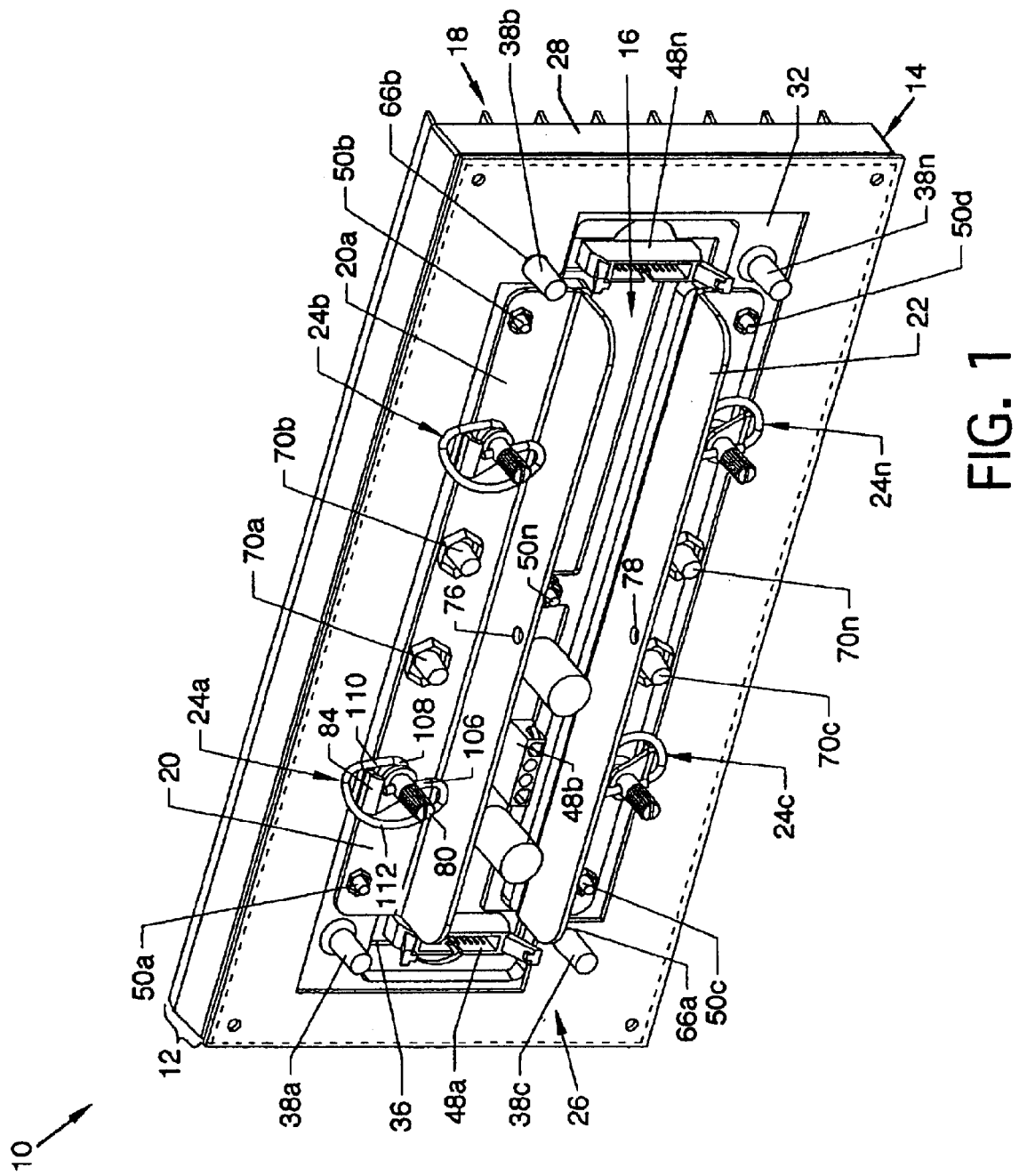
FIG. 1 is an isometric rear view of an LED module latch system, the present invention.

FIG. 1 is an isometric rear view of an LED module latch system 10, the present invention. Major features or components of the invention, which are readily viewable in FIGS. 1 or 2, include an LED module 12 having an LED housing 14, an LED panel 16 aligned and mated into the LED housing 14, a louver panel 18 aligned to the front of the LED panel 16 and secured to the LED housing 14, upper and lower latch support brackets 20 and 22, respectively, aligned and secured to the rear of the LED housing 14, and a plurality of helical spring latches 24a–24n distributed along and about the upper and lower latch support brackets 20 and 22. Also shown as part of the LED module latch system 10 is a mounting panel 26 to which the LED module 12 secures. The helical spring latches 24a–24n are shown engaging the mounting panel 26 to fasten the LED module 12 to the mounting panel 26.

Figure 2:
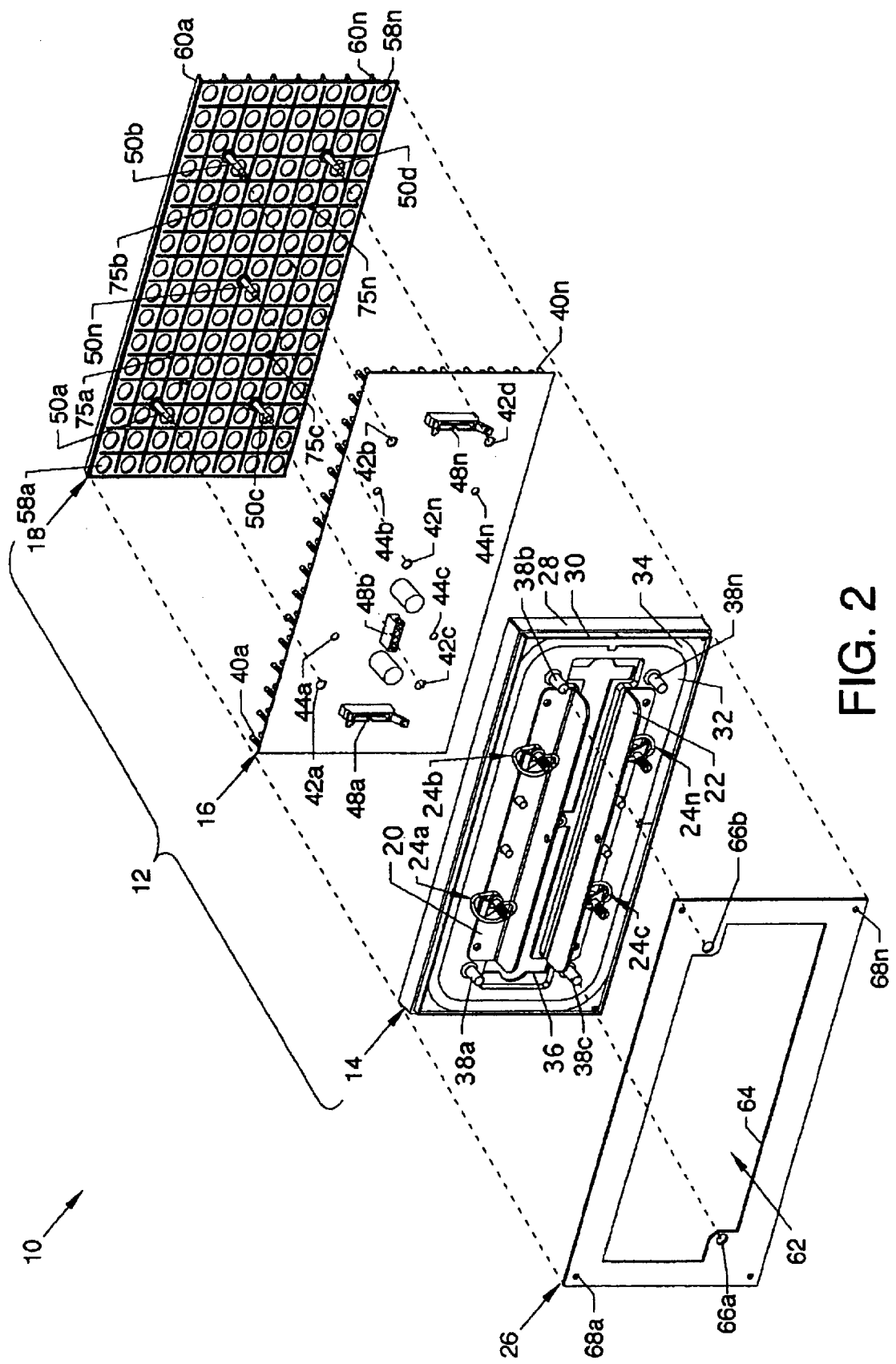
FIG. 2 is an exploded isometric rear view of the components of FIG. 1.

FIG. 2 is an exploded isometric rear view of the components of the LED module latch system 10. In addition to the components described with reference to FIG. 1, the LED housing 14 of the LED module 12 includes a continuous edge 28, a continuous lip 30 extending about and rearwardly from the continuous edge 28, a configured multi-level subpanel 32 being part of the LED housing 14, a gasket 34 extending along and about the outer reaches of the configured subpanel 32 adjacent the continuous lip 30 to seal against the mounting panel 26, thus forming a water barrier, an interrupted configured cutout 36 extending through the central portion of the subpanel 32, alignment posts 38a–38n extending rearwardly from the subpanel 32, and other features described herein.

Also shown in FIG. 2 is the LED panel 16 which aligns to and secures through the front surface of the LED housing 14. The LED panel 16 is a printed circuit board having a plurality of LEDs 40a–40n arranged in a matrix and physically and electrically secured thereto and extending forwardly from the front surface thereof to display alphanumeric or other graphic images. Although LEDs are incorporated to display alphanumeric or other graphic images, other devices, such as, but not limited to, liquid crystal displays (LCD), incandescent displays, or other displays may be incorporated and shall not be limiting to the scope of the invention. A plurality of body holes 42a–42n are included extending through the LED panel 16. A plurality of further body holes 44a–44n also extend through the LED panel 16 and align with and are closely accommodated by the structure forming recessed access holes 46a–46n in the subpanel 32 (FIGS. 3 and 7) to align with forward facing portions of pivot pins 80 (FIGS. 3 and 7) of the helical spring latches 24a–24n of the LED housing 14. A plurality of connectors 48a–48n mount to and extend rearwardly from the LED panel 16 to align within and extend through the interrupted configured cutout 36 of the subpanel 32 of the LED housing 14 for connection to distanced power sources and electrical control sources for operation of the display.

Figure 3:
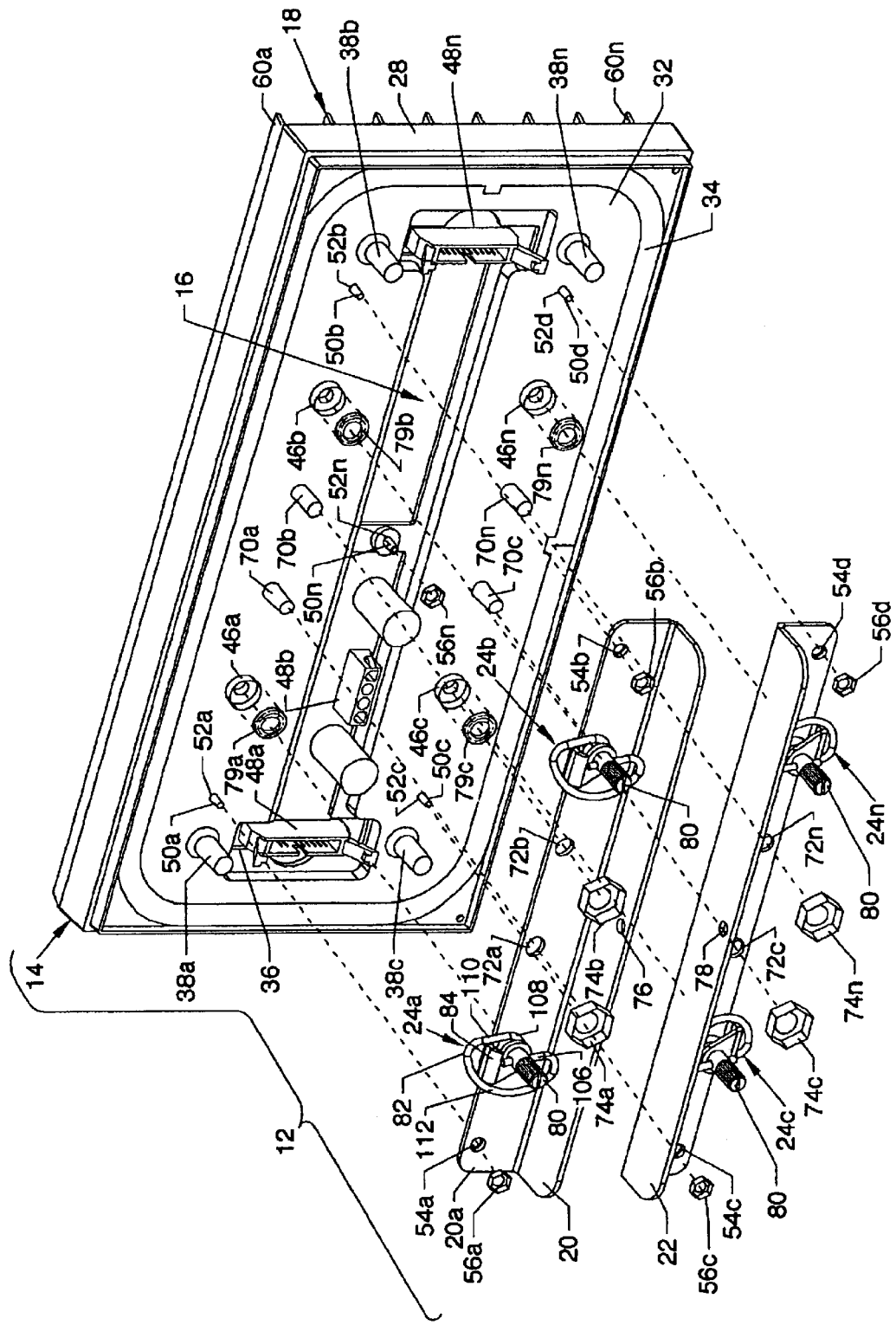
FIG. 3 is a partially exploded isometric view of the LED modules showing the alignment of the upper and lower latch support brackets and helical spring latches with the components and features associated with the rearward facing region of the LED housing.

Louver panel 18 aligns over and about the LED panel 16 and secures to the LED housing 14 and to the upper latch support bracket 20 and the lower latch support bracket 22 by a plurality of rearwardly extending attachment posts 50a–50n aligned to and which pass through the plurality of body holes 42a–42n in the LED panel 16, and through a plurality of body holes 52a–52n (FIG. 3) in the subpanel 32 of the LED housing 14. As shown in FIG. 3, attachment posts 50a, 50b, 50c and 50d then align with and to later pass through body holes 54a, 54b, 54c and 50d, respectively, of the upper latch support bracket 20 and the lower latch support bracket 22, and attachment post 50n aligns through the hole 52n of the subpanel 32. A plurality of properly sized nuts 56a–56n secure to the ends of the attachment posts 50a–50n to partially complete the mutual fastening of the louver panel 18, the included LED panel 16, and the LED housing 14 and its included upper latch support bracket 20, lower latch support bracket 22, and helical spring latches 24a–24n to form the LED module 12. Further, fastening of the upper latch support bracket 20 and the lower latch support bracket 22 to the LED housing 14 is described with reference to FIG. 3. The louver panel 18 also includes a plurality of holes 58a–58n arranged in a matrix corresponding to the plurality of LEDs 40a–40n in matrix arrangement and a plurality of horizontally aligned and spaced louvers 60a–60n above each row of holes included in the whole set of holes 58a–58n.

Also included in the LED module latch system 10 is the mounting panel 26 including a cutout 62 bounded by a continuous edge 64 and configured to accommodate the geometry of the upper latch support bracket 20, the lower latch support bracket 22, and the attached helical spring latches 24a–24n. Also included in the mounting panel 26 are two diagonally opposed alignment holes 66a–66b for use in attaching the mounting panel 26 to the LED module 12, and a plurality of holes 68a–68n for further attachment of the mounting panel 26 to the structure of cabinetry (not shown). Alignment posts 38c and 38b align the LED module 12 with the holes 66a and 66b, respectively, of the mounting panel 26.

Figure 7:
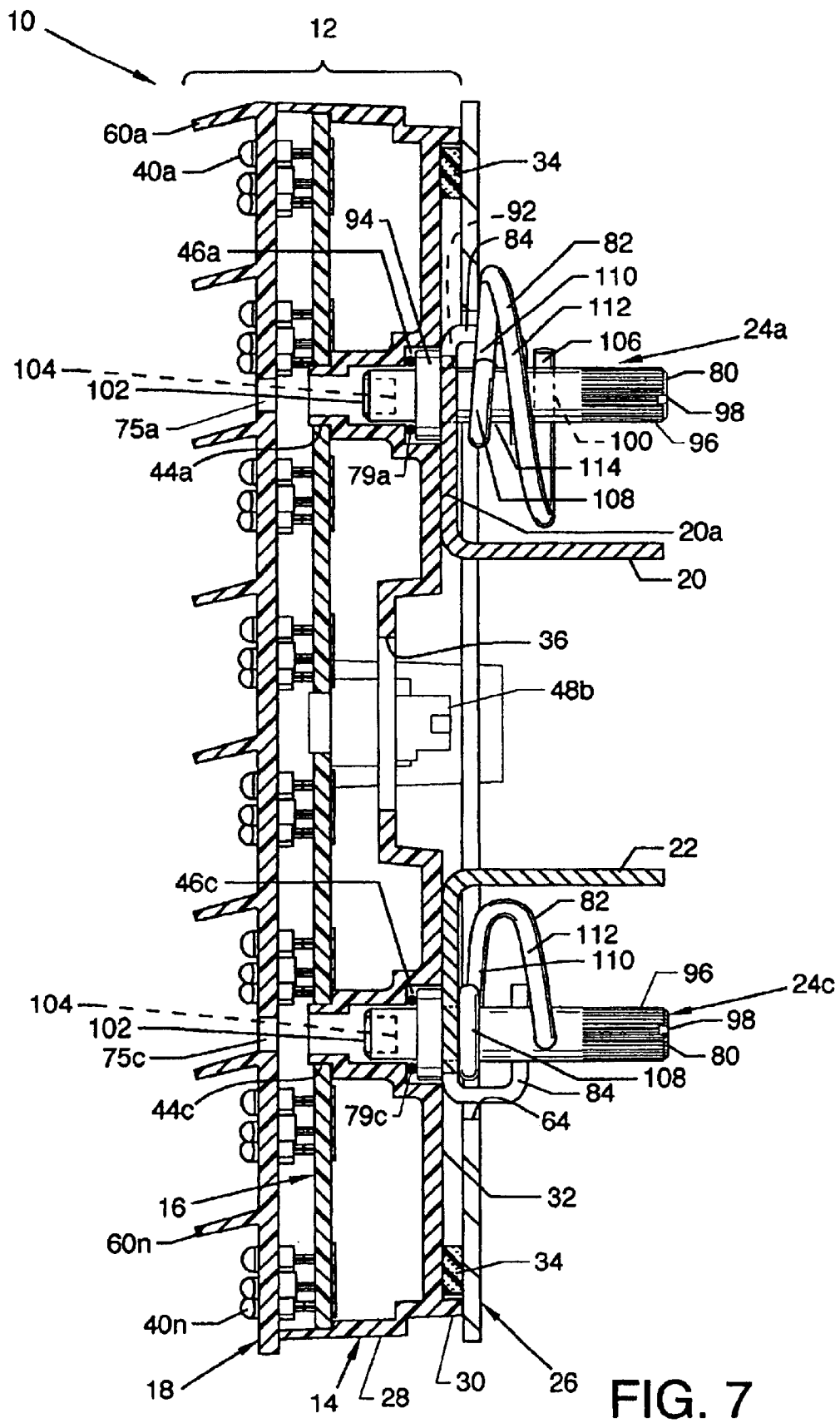

FIG. 3 is a partially exploded isometric view of the LED module 12 showing the alignment of the upper and lower latch support brackets 20 and 22 and helical spring latches 24a–24n with the components and features associated with the rearward facing region of the LED housing 14. A plurality of attachment posts 70a–70n extending rearwardly from the subpanel 32 of the LED housing 14 align with and pass through a plurality of body holes 72a–72n, respectively, on the upper and lower latch support brackets 20 and 22 and are accommodated by a plurality of nuts 74a–74n to complete the attachment of the upper and lower latch support brackets 20 and 22 and attached helical spring latches 24a–24n to the LED housing 14. Also shown are the recessed access holes 46a–46n which are multi-radiused and which are aligned to the forward facing portions or features of the pivot pins 80 of the helical spring latches 24a–24n. Each larger and rearwardly directed portion of the recessed access holes 46a–46n accommodates an annular shoulder 94 (FIG. 7) of a pivot pin 80, thereby allowing a close fitting of the upper and lower latch support brackets 20 and 22 and helical spring latches 24a–24n to the subpanel 32. The smaller portions of the recessed access holes 46a–46n allow close accommodation of the forward facing ends of the pivot pins 80 and allow access through access holes 75a–75n (FIGS. 2 and 7) in the louver panel 18 where the helical spring latches 24a–24n can be accessed from the front of the LED module latching system 10. Sealing washers 79a–79n align in the rearwardly directed portion of the recessed access holes 46a–46n to seal the pivot pins 80 to the subpanel 32, as shown in FIG. 7. Attachment holes 76 and 78 are located on the upper and lower latch support brackets 20 and 22 for attachment of a lanyard or other such safety device for use in service work where it is desired to prevent accidental dropping of the LED module 12.

Figure 4:
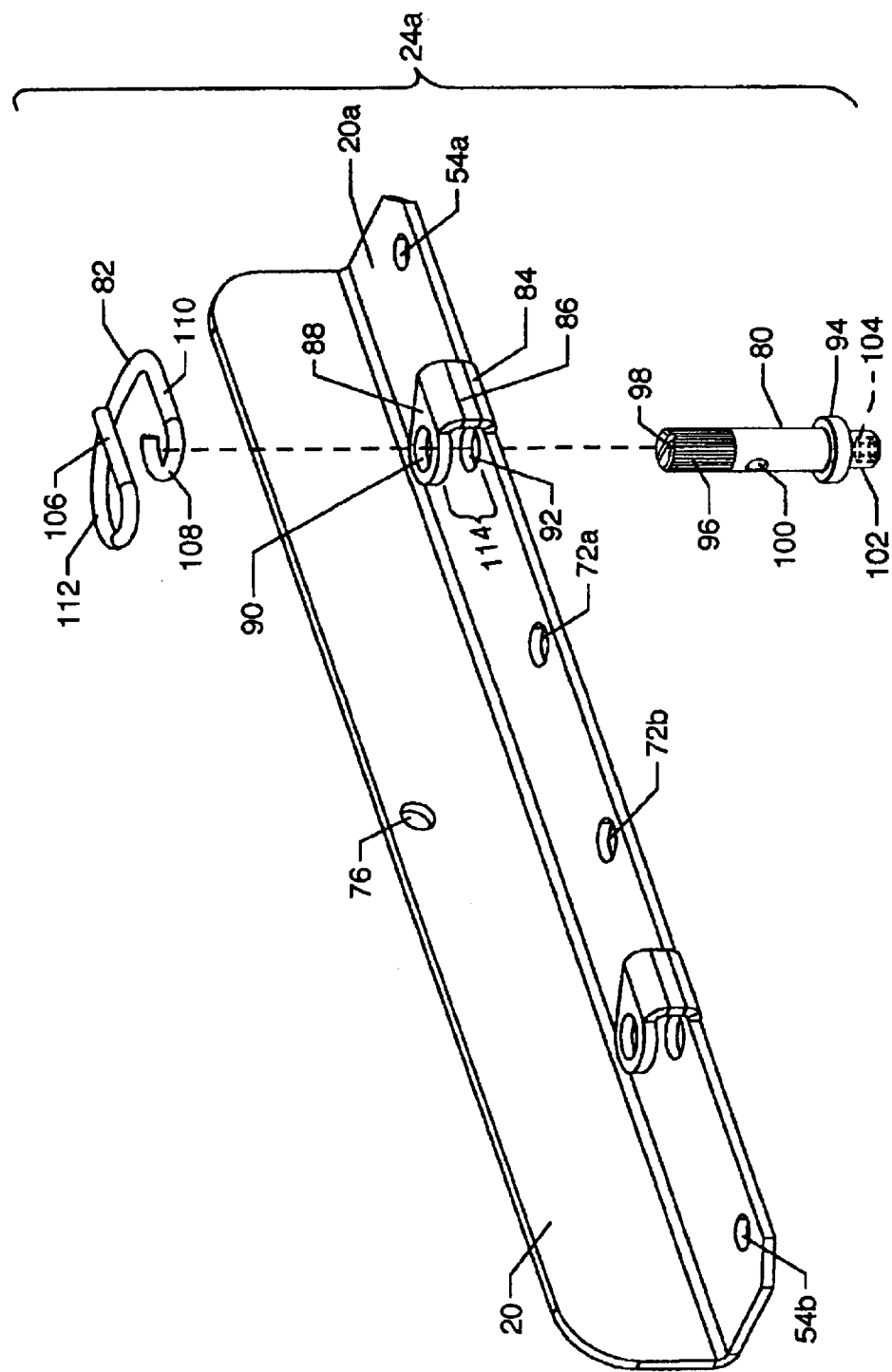
FIG. 4 is an exploded isometric reoriented view of a helical spring latch of the similarly constructed and incorporated helical spring latches in relationship to the upper latch support bracket.

FIG. 4 is an exploded isometric reoriented view of the helical spring latch 24a of the similarly constructed and incorporated helical spring latches 24a–24n in relationship to the upper latch support bracket 20. Each helical spring latch 24a–24n is similarly configured and each is supported by one of the mounting fixtures 84 located on the upper and lower latch support brackets 20 and 22. Each of the helical spring latches 24a–24n includes a mutually engaging helical spring 82 and a pivot pin 80 attached and aligned to each other and to a mounting fixture 84. The helical spring 82, having a top view profile being that generally of a D-ring, secures around, about and through the pivot pin 80. The side view profile of the helical spring 82 is that resembling a ramped helical member aligned between other members in different planes.

The mounting fixture 84 includes an extension 86 aligned substantially at a right angle to a planar panel 20a of the upper latch support bracket 20, and another extension 88 aligned at a right angle to extension 86. A hole 90 extends through the extension 88 to align with a corresponding hole 92 in the planar panel 20a. Holes 90 and 92 serve to rotatingly accommodate the pivot pin 80.

Figure 5:
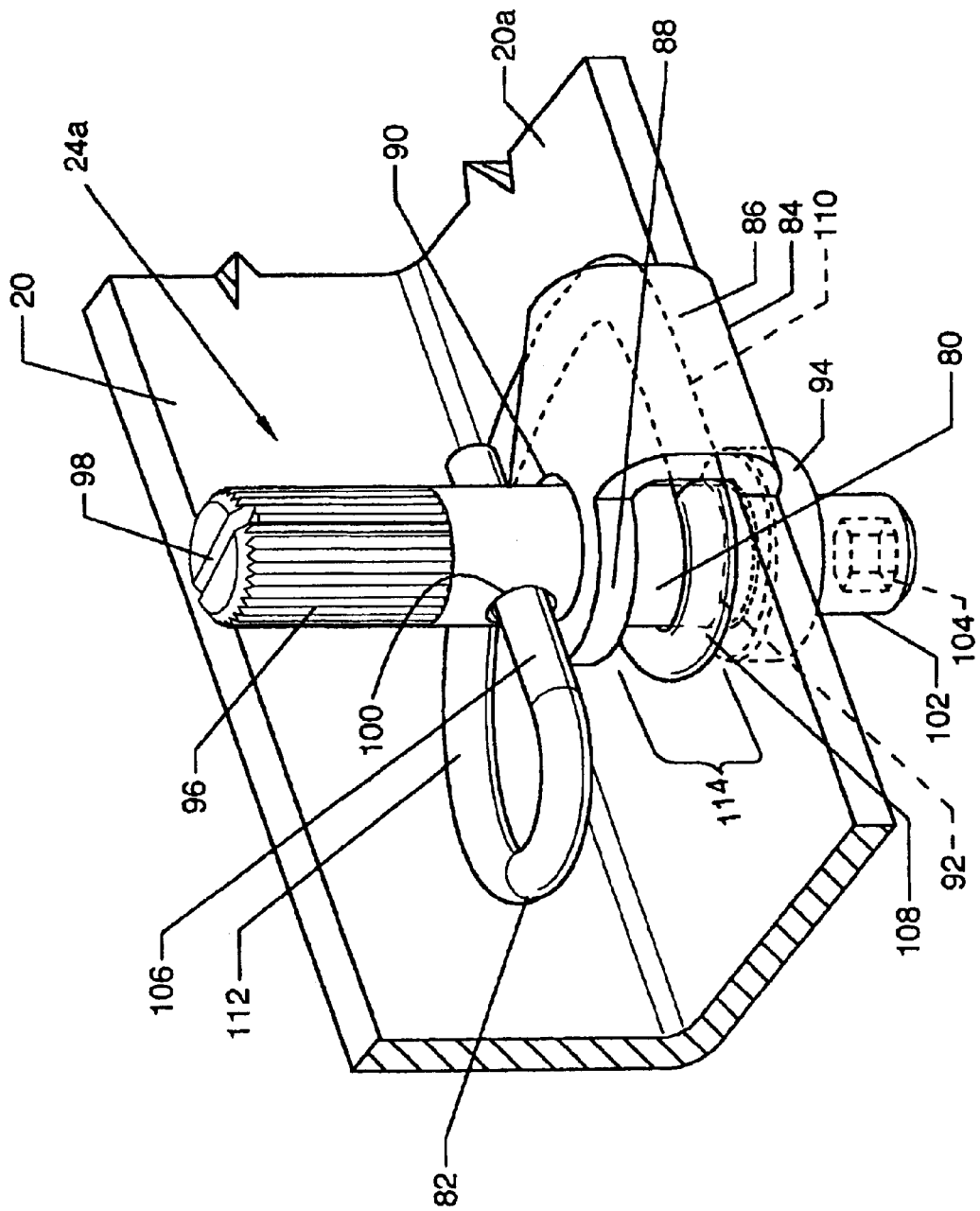
FIG. 5 illustrates an assembled helical spring latch oriented in the full clockwise position such as utilized prior to intimate engagement with the mounting panel.

Pin 80 includes an annular shoulder 94 near one end and a fluted section 96 at the other end. For rotational access from the rear of the LED module latch system 10, a screwdriver slot 98 or other suitable arrangement such as, but not limited to, Phillips head slots, Allen head receptacle, a square driver receptacle or the like which can be utilized by a suitable hand tool, is located at the end of the pivot pin 80 having the fluted section 96. A hole 100 extends through the pivot pin 80 to accommodate the straight end 106 of the helical spring 82, as shown in FIG. 5. A pivot pin extension 102 extends from the annular shoulder 94 and optionally includes an Allen head socket 104 or other suitable arrangement such as, but not limited to, a screwdriver slot, Phillips head slots, a square driver receptacle or the like which can be utilized by a suitable hand tool which is useful for actuation of the helical spring latch 24a from the front of the LED module latch system 10 through the holes 75a–75n of the louver panel 18. The helical spring 82 entails features enabling it to suitably engage the pivot pin 80, including the straight end 106 and an opposing substantially semicircular end 108 where the straight end 106 and the substantially semicircular end 108 oppose each other in opposing planes. The helical spring 82 includes intermediate adjoining sections between the straight end 106 and the substantially semicircular end 108, including a noncurved section 110 adjacent to the substantially semicircular end 108 and an angled and curved and ramped transcending section 112 adjacent to the straight end 106.

Figure 6:
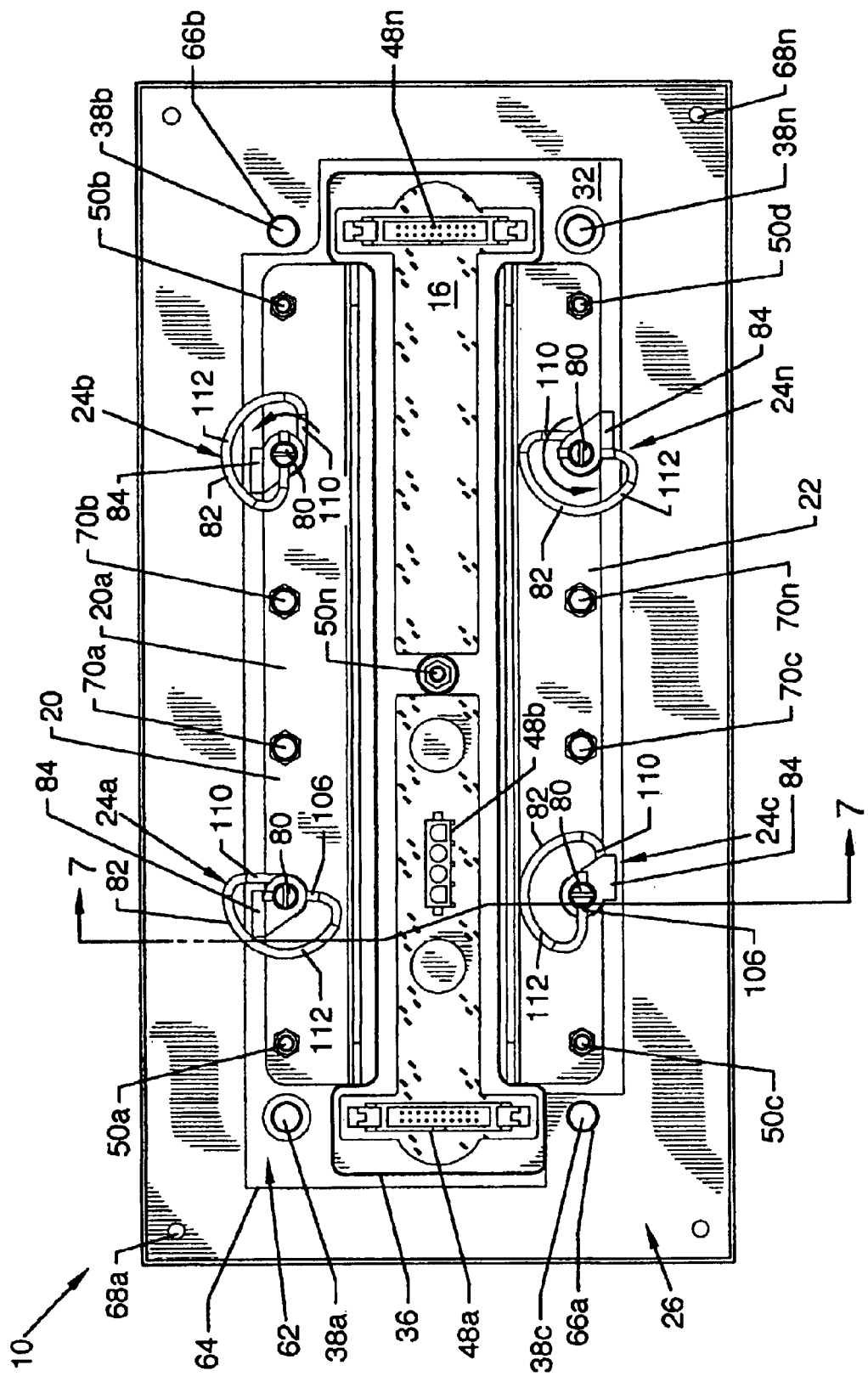
FIG. 6 is a rear view of the LED module latch system showing sequenced positioning and engagement of the helical springs of the LED module to the mounting panel; and, FIG. 7 is a cross sectional side view along line 7-7 of FIG. 6.

FIG. 5 illustrates an assembled helical spring latch 24a oriented in the full clockwise position, such as utilized prior to intimate engagement with the mounting panel 26. The pivot pin 80 and the helical spring 82 can be rotationally positioned approximately 270° to intimately engage the mounting panel 26, as later described in detail. As illustrated, the pivot pin 80 is aligned to and through and supported by holes 90 and 92 where the annular shoulder 94 is made to bear against the planar panel 20a by the dynamic spring qualities of and by the arrangement of the helical spring 82 with respect to the pivot pin 80 and planar panel 20a. The substantially semicircular end 108 extends in an arc slightly greater than 180° and force captures about the pivot pin 80 to maintain coupling about the pivot pin 80. The straight end 106 of the helical spring 82 engages the hole 100 extending through the pivot pin 80. The substantially semicircular end 108 and adjacent noncurved section 110 of the helical spring 82 are forced to maintain tensioned intimate contact with the upper surface of the planar panel 20a by the force of the helical spring 82 which is compressed between the planar panel 20a and the hole 100 of the pivot pin 80. Force of the helical spring 82 is useful in capturing the mounting panel 26, as later described in detail. A space 114 between the planar panel 20a and the extension 88 of the mounting fixture 84 is of sufficient dimension to allow for angular displacement and flexing of the substantially semicircular end 108 of the helical spring 82 therebetween and along a small portion of the pivot pin 80 when the helical spring latch 24a is utilized for intimate engagement of the mounting panel 26. As shown, the extension 86 of the mounting fixture 84 is utilized as a rotation stop when the pivot pin 80 and helical spring 82 are positioned (full clockwise in the figure) to avoid intimate engagement with the mounting panel 26. The rotational stop is effected upon contact of the noncurved section 110 of the helical spring 82 with the extension 86 of the mounting fixture 84. Also, the extension 86 of the mounting fixture 84 is utilized as a rotation stop when the pivot pin 80 and helical spring 82 are positioned (full counterclockwise) to participate in intimate engagement of the helical spring latch 24a with the mounting panel 26, as shown in FIG. 6. This rotational stop is effected upon contact of the noncurved section 110 of the helical spring 84 with the vertical sidewall of the extension 86 of the mounting fixture 84. The helical spring 82 is mounted off center from the pivot pin 80 and is rotated to eccentrically and sweepingly position the D-shaped helical spring 82 over and about a portion of the mounting panel 26 to provide for intimate frictional engagement thereto, or is positioned by rotation in an opposite rotation to disengage from or to avoid intimate frictional engagement therefrom.

Mode of Operation

FIG. 6 is a rear view of the LED module latch system 10 showing sequenced positioning and engagement of the helical springs 82 of the LED module 12 to the mounting panel 26 where the sequence order starts first referencing the helical spring latch 24c followed in order by the helical spring latches 24n, 24b and 24a, where each successive pivot pin 80 and helical spring 82 of the helical spring latches 24a–24n are advanced approximately 90° with reference to the preceding position shown in each preceding helical spring latch 24a–24n.

Operation of the invention is initiated by first securing a desired quantity of mounting panels 26 on and about the front portion of cabinetry utilized for enclosing and mounting of the LED module latching systems 10 subsequent to which a desired quantity of LED modules 12 are aligned and mounted thereto utilizing the teachings of the invention. The installation continues by rotating the pivot post 80 and the helical spring 82 of each of the helical spring latches 24a–24n to the full clockwise position, such as shown by the illustration of the helical spring 82 and pivot pin 80 of the helical spring latch 24c. Such positioning allows the overall profile of the upper latch bracket 20, the lower latch bracket 22, and the suitably positioned helical spring latches 24a–24n to assume a suitable profile to successfully negotiate the cutout 62 bounded by the continuous edge 64 of the mounting panel 26. Next, the LED module 12 is aligned to the mounting panel 26 utilizing the alignment posts 38c and 38b extending rearwardly from the LED module 12 which are positioned in alignment with the alignment holes 66a and 66b, respectively, of the mounting panel 26. Once the LED module 12 is mated against the mounting panel 26, the pivot pins 80 and the helical springs 82 of the helical spring latches 24a–24n are rotatingly positioned to engage the mounting panel 26.

In the sequenced illustration, the pivot pin 80 and the helical spring 82 of the helical spring latch 24c have not been rotatingly positioned to engage the mounting panel 26 or the continuous edge 64 of the panel cutout 62 and are shown reflecting the starting or 0° (zero degree) rotation position (along with the other pivot pins 80 and the helical springs 82 as previously described) which allows for positioning of the LED module 12 against the mounting panel 26. Rotation of the pivot pin 80 and the helical spring 82 to the 90° rotation position, as shown for the helical spring latch 24n, positions the leading portion of the transcending section 112 of the helical spring 82 over but not touching the mounting panel 26 or the continuous edge 64 of the cutout 62 in the mounting panel 26. Rotation of the pivot pin 80 and the helical spring 82 from the 90° rotation position to the 180° rotation position, as shown for the helical spring latch 24b, initiates contact of the transcending section 112 of the helical spring 82 against the mounting panel 26 at the continuous edge 64 of the cutout 62 in the mounting panel 26 to exert light pressure thereupon. Further, rotation of the pivot pin 80 and the helical spring 82 from the 180° rotation position to the 270° rotation position, as shown for the helical spring latch 24a, completes contact and causes, by the spring action of the helical spring 82, fully exerted and forced intimate engagement of a portion of the transcending section 112 of the helical spring 82 in addition to such similar engagement of the leading portion of the noncurved section 110 of the helical spring 82 against the mounting panel 26 and/or against the planar panel 20a and/or at the continuous edge 64 of the cutout 62 in the mounting panel 26. Complete secured attachment of the LED module 12 to the mounting panel 26 occurs when each of the pivot pins 80 and helical springs 82 has been positioned fully in all of the helical spring latches 24a–24n, such as shown for pivot pin 80 and helical springs 82 in the helical spring latch 24a.

Attachment of control wires to the connectors 48a–48n can occur prior to or after engagement of the LED module 12 to the mounting panel 26 depending on which side the LED module latch system 10 was accessed.

The Mode Of Operation continues with reference to FIG. 7, a cross sectional side view along line 7-7 of FIG. 6. The helical spring latch 24c is shown positioned in a manner, i.e., the 0° (zero degree) rotation position, that all of the helical spring latches 24a–24n would assume to ensure component clearance prior to mating of the LED module 12 adjacent to the cutout 62 and continuous edge 64 of the mounting panel 26. The helical spring latch 24a is shown positioned in a manner, i.e., the 270° rotation position that all of the helical spring latches 24a–24n would assume upon full and complete intimate mating, engagement and securing of the LED module 12 adjacent to the cutout 62 of the mounting panel 26. Engagement of each of the helical spring latches 24a–24n is initiated by rotationally positioning the pivot pins 80 from the rear by manually grasping the fluted sections 96 of the pivot pins 80 and rotating in a suitable direction to start the engagement process from the previously described 0° position and continuing through the 90° rotation position, through the 180° rotation position, and to the 270° rotation position. Alternately, rotation could be obtained from the rear of the LED module latch system 10 by employing a screwdriver or other suitable hand tool to engage the screwdriver slot 98 or other suitable arrangement as previously described at the rearward facing fluted section 96 of the pivot pin 80, or from the front of the LED module latch system 10 by insertion of an Allen wrench or other suitable hand tool through one of the holes 75a–75n in the louver panel 18 to engage an Allen head socket 104 or other suitable arrangement in the forward facing region of the pivot pin 80.

Various modifications can be made to the present invention without departing from the apparent scope hereof.

Led Module Latch System

Parts List

10 LED module system
12 LED module
14 LED housing
16 LED panel
18 louver panel
20 upper latch support bracket
20a planar panel
22 lower latch support bracket
24a–n helical spring latches
26 mounting panel
28 continuous edge
30 continuous lip
32 subpanel
34 gasket
36 interrupted configured cutout
38a–n alignment posts
40a–n LEDs
42a–n body holes
44a–n body holes
46a–n recessed access holes
48a–n connectors
50a–n attachment posts
52a–n body holes
54a–b body holes
56a–n nuts
58a–n holes
60a–n louvers
62 cutout
64 continuous edge
66a–b alignment holes
68a–n holes
70a–n attachment posts
72a–n body holes
74a–n nuts
75a–n access holes
76 attachment hole
78 attachment hole
79a–n sealing washers
80 pivot pin
82 helical spring
84 mounting fixture
86 extension
88 extension
90 hole
92 hole
94 annular shoulder
96 fluted section
98 screwdriver slot
100 hole
102 pivot pin extension
104 Allen head socket
106 straight end
108 substantially semicircular end 110 noncurved section
112 transcending section
114 space

What is claimed is:

1. An LED module latch system comprising:
   a. a mounting panel; and,
   b. an LED module, the LED module including:
      (1) an LED housing, the LED housing having a front side and a rear side, the rear side of the LED housing including angled latch support brackets, each of the angled latch support brackets having a plurality of helical spring latches, which helical spring latches interface between the LED housing and the mounting panel;
      (2) an LED panel carried on the front side of the LED housing; and,
      (3) a louver panel carried in front of the LED panel.

2. The LED module latch system of claim 1, wherein the angled latch support brackets further include mounting fixtures for support of the helical spring latches located on each latch support bracket to provide for securing of the helical spring latches, each of the helical spring latches including a mutually engaging helical spring and a pivot pin attached and aligned to each other and to one of the mounting fixtures.

3. The LED module latch system of claim 2, wherein each of the helical springs has a top view profile generally of a D-ring.

4. The LED module latch system of claim 2, wherein each of the helical springs has a top view profile generally of a D-ring secured around and aside, about and through, the pivot pin.

5. The LED module latch system of claim 2, wherein each of the helical springs has a top view profile generally of a D-ring secured around and aside, about and through, a pivot pin, with the helical spring mounted off-center from the pivot pin and rotatable, in a first rotational direction with the pivot pin, to sweepingly position the D-shaped profile over and about a portion of the mounting panel to provide for intimate frictional engagement thereto.

6. The LED module latch system of claim 5, wherein rotation of each of the pivot pins and helical springs in a second rotational direction, opposite the first rotational direction, provides disengagement from intimate frictional engagement with the mounting panel.

7. The LED module latch system of claim 1, wherein the angled latch support brackets are secured to the rear of the LED housing and include mounting fixtures extending rearwardly from the latch support brackets, with helical spring latches, each helical spring latch including:
   a. a pivot pin; and,
   b. a connected helical spring, secured via the mounting fixtures to the angled latch support brackets.

8. The LED module latch system of claim 1, wherein the mounting panel includes a cutout and serves as a mounting base to which the LED module is secured by action of the helical spring latches.

9. The LED module latch system of claim 5, wherein at least one of the pivot pins has a first end, the first end including means to facilitate rotation of the pin.

10. The LED module latch system of claim 9, wherein the means to facilitate rotation includes a fluted portion.

11. The LED module latch system of claim 9, wherein the means to facilitate rotation is characterized by a hand tool interface.

12. The LED module latch system of claim 11, wherein the means to facilitate rotation characterized by a hand tool interface includes a structure selected from the group consisting of a screw driver slot, a Phillips head slot, an Allen head receptacle, and a square drive receptacle.

13. The LED module latch system of claim 9, wherein the at least one pin of the pivot pins includes a second end with a second means to facilitate rotation of the pin.

14. The LED module latch system of claim 13, wherein the second means to facilitate rotation of the pivot pin is characterized by a hand tool interface.

15. The LED module latch system of claim 14, wherein the second means to facilitate rotation characterized by a hand tool interface includes a structure selected from the group consisting of a screw driver slot, a Phillips head slot, an Allen head receptacle, and a square drive receptacle.

16. The LED module latch system of claim 9, wherein pin includes second end and a second means to facilitate rotation located at the second end and wherein the means to facilitate rotation of the first end is a structure different from the second means to facilitate rotation.

17. The LED module latch system of claim 9, wherein pin includes second end and a second means to facilitate rotation located at the second end and wherein the means to facilitate rotation of the first end is a structure identical to the second means to facilitate rotation.

18. The LED module latch system of claim 9, wherein the first end of the pin is directed rearwardly.

19. The LED module latch system of claim 18, wherein the first end of the pin is accessible from rearward of the mounting panel.

20. The LED module latch system of claim 9, wherein the first end of the pin is directed forwardly and is accessible through the louver panel.

21. The LED module latch system of claim 13, wherein the first end of the pin is directed rearwardly and is accessible from rearward of the mounting panel and the second end of the pin is directed forwardly and is accessible through the louver panel.

22. The LED panel latch system of claim 5, wherein the helical spring and pivot pin have a side view profile resembling a ramped helical member.

23. The LED panel latch system of claim 5, wherein the helical spring includes a straight end and the pivot pin includes a transversely oriented hole for accommodating the straight end of the helical spring.

24. The LED panel latch system of claim 23, wherein the helical spring includes a ramped transcending section adjacent the straight end of the helical spring.

25. The LED module latch system of claim 24, wherein the helical spring includes a noncurved section adjacent the ramped transcending section.

26. The LED module latch system of claim 25, wherein the helical spring includes a substantially semicircular end adjacent the noncurved section.

27. The LED module latch system of claim 23, wherein the helical spring includes a straight end and a substantially semicircular end.

28. The LED module latch system of claim 27, wherein the helical spring includes a straight end and a substantially semicircular end situated in opposition and in opposing planes.

29. The LED module latch system of claim 2, wherein each of the pivot pin and helical spring combinations are rotatably carried on the angled latch support bracket by a hole in the latch support bracket.

30. The LED module latch system of claim 29, wherein the hole in the latch support bracket is aligned with a second hole rotatably carrying the pivot pin and helical spring combination, the second hole being in an extension of the angled latch support bracket, the extension being carried by a right angle extension of the latch support bracket and spaced apart from the latch support bracket.

31. The LED module latch system of claim 30, wherein the right angle extension is rotation stop to the pivot pin and helical spring combination.

32. The LED module latch system of claim 29, wherein the helical spring is rotatable by actuation of the pivot pin between a first rotation position and a second rotation position, the first rotation position situating the helical spring generally over the latch support bracket to define a disengagement position and the second rotational position situating the helical spring generally past an edge of the latch support bracket to define an engagement position.

33. The LED module latch system of claim 32, wherein the LED module is mateable to the mounting panel when all the helical springs are rotated to the disengaged position.

34. The LED module latch system of claim 32, wherein rotation of pivot pin and helical spring combination from the disengaged position to the engaged position while extending rearwardly through the cutout of the mounting panel causes the helical spring to engage the mounting panel.

35. The LED module latch system of claim 32, wherein rotation of pivot pin and helical spring combination from the engaged position to the disengaged position while extending rearwardly through the cutout of the mounting panel and engaging the mounting panel causes the helical spring to disengage from the mounting panel and enable the LED module to be separated from the mounting panel.

36. The LED module latch system of claim 32, wherein rotation of pivot pin and helical spring combination from the disengaged position to the engaged position while extending rearwardly through the cutout of the mounting panel further causes the helical spring to resiliently compress while engaging the mounting panel.

37. A method of maintaining an LED display, the LED display characterized by a plurality of LED modules matingly engaging a mounting panel of the LED display by as of:

a. rotating at least one helical spring of an undesired LED module of the plurality of LED modules by rotating a pivot pin to rotatably reposition the helical spring so as to disengage the spring from the mounting panel; and, b. unmating the undesired LED module from the mounting panel.

38. The method of claim 37, further comprising the steps of:

a. mating another LED module to the mounting panel where the undesired LED module was previously unmated; and, b. rotating the at least one helical spring of the another LED module to engage the mounting panel.

39. The method of claim 38, wherein the rotations of both of the at least one helical springs are performed from the front of the LED display.

40. The method of claim 38, wherein the rotations of both of the at least one helical springs are performed from the rear of the LED display.

41. The method of claim 38, wherein the steps of rotating the helical springs include application of a hand tool to the pivot pins.

42. The method of claim 38, further comprising the steps of:

a. electrically disconnecting the undesired LED module; and, b. electrically disconnecting the another LED module.

43. A method of assembling an LED display, the LED display characterized by the presence of a mounting panel for matingly engaging a plurality of LED modules, each of the LED modules of the plurality having at least one helical spring rotatable by a pivot pin, comprising the steps of:

a. mating an LED module of the plurality to the mounting panel; and, b. rotating the at least one helical spring of the LED module to engage the mounting panel.

44. The method of claim 43, wherein the rotation of the at least one helical spring is performed from the front of the LED display.

45. The method of claim 43, wherein the rotation of the at least one helical spring is performed from the rear of the LED display.

46. A fastener for resiliently capturing a panel comprising:

a. a pivot pin, the pivot pin having a transverse hole and a shoulder spaced apart from the transverse hole; and, b. a helical spring, the spring including:

(1) a straight end, the straight end being accommodated by the transverse hole in the pivot pin; and, (2) an angled, curved and ramped transcending section adjacent the straight end; and, wherein rotation of the pivot pin manipulates and progressively drives the angled, curved and ramped transcending section of the helical spring against the panel in opposition to the shoulder so as to resiliently capture the panel.

47. The fastener of claim 46, wherein the pivot pin includes means to facilitate rotation.

48. The fastener of claim 47, wherein the means to facilitate rotation includes a fluted section.

49. The fastener of claim 47, wherein the means to facilitate rotation includes an end structure on one end of the pivot pin.

50. The fastener of claim 49, wherein the end structure is selected from the group consisting of a screw driver slot, a Phillips head slot, an Allen head receptacle, and a square drive receptacle.

51. The fastener of claim 47, wherein the means to facilitate rotation includes an end structure on each end of the pivot pin, the end structures for each end of the pivot pin being separately selected from the group consisting of a screw driver slot, a Phillips head slot, an Allen head receptacle, and a square drive receptacle.

52. The fastener of claim 51, further comprising a fluted section on the pivot pin.

53. The fastener of claim 46, wherein the pin has a first and second ends and the shoulder and the transverse hole are both spaced apart from the first and second ends.

* * * * *